(12) United States Patent
Chu

(10) Patent No.: US 8,775,760 B2
(45) Date of Patent: Jul. 8, 2014

(54) MODIFYING A HOST INTERFACE SETTING FOR A NON-VOLATILE MEMORY MODULE

(75) Inventor: Chien-Hua Chu, Hsinchu County (TW)

(73) Assignee: Phison Electonics Corp., Miaoli (TW)

( * ) Notice: Subject to any disclaimer, the term of this patent is extended or adjusted under 35 U.S.C. 154(b) by 160 days.

(21) Appl. No.: 13/479,293

(22) Filed: May 24, 2012

(65) Prior Publication Data

US 2013/0282959 A1 Oct. 24, 2013

(30) Foreign Application Priority Data

Apr. 23, 2012 (TW) .............................. 101114415 A

(51) Int. Cl.
*G06F 12/06* (2006.01)
*G06F 13/42* (2006.01)
*G06F 12/02* (2006.01)

(52) U.S. Cl.
CPC ........ *G06F 12/0646* (2013.01); *G06F 12/0246* (2013.01); *G06F 13/42* (2013.01); *G06F 2212/7206* (2013.01)
USPC ................... 711/166; 711/103; 711/E12.008; 711/E12.084

(58) Field of Classification Search
CPC . G06F 13/42; G06F 12/0246; G06F 12/0646; G06F 2212/7206
USPC ................... 711/103, 166, E12.008, E12.084
See application file for complete search history.

(56) References Cited

U.S. PATENT DOCUMENTS

| | | | |
|---|---|---|---|
| 8,504,789 B2* | 8/2013 | Pyeon et al. ................... | 711/167 |
| 2003/0079077 A1* | 4/2003 | Piau et al. ...................... | 711/103 |
| 2008/0046642 A1* | 2/2008 | Mori et al. ..................... | 711/103 |
| 2008/0086588 A1* | 4/2008 | Danilak et al. ................. | 711/103 |
| 2009/0103362 A1* | 4/2009 | Pekny et al. .............. | 365/185.04 |
| 2009/0187702 A1* | 7/2009 | Kozakai et al. ............... | 711/103 |
| 2011/0113212 A1* | 5/2011 | Chi et al. ....................... | 711/163 |
| 2011/0197017 A1* | 8/2011 | Yu et al. ........................ | 711/103 |
| 2012/0084490 A1* | 4/2012 | Choi et al. ..................... | 711/103 |

* cited by examiner

*Primary Examiner* — Hal Schnee
(74) *Attorney, Agent, or Firm* — Jianq Chyun IP Office

(57) ABSTRACT

A system operation method for controlling a rewritable non-volatile memory module is provided. The rewritable non-volatile memory module includes a plurality of physical blocks. The system operation method includes following steps. A first signal is received from a host system through a host interface. Whether a system setting of the host interface is to be modified is determined. If the system setting is to be modified, a system parameter is read from the physical blocks, and the system setting is modified according to the system parameter. A second signal is transmitted to the host system to establish a connection recognition between the rewritable non-volatile memory module and the host system. Thereby, the settings of transmission between the host system and the rewritable non-volatile memory module are made more flexible.

24 Claims, 6 Drawing Sheets

MODIFYING A HOST INTERFACE SETTING FOR A NON-VOLATILE MEMORY MODULE

CROSS-REFERENCE TO RELATED APPLICATION

This application claims the priority benefit of Taiwan application serial no. 101114415, filed on Apr. 23, 2012. The entirety of the above-mentioned patent application is hereby incorporated by reference herein and made a part of this specification.

BACKGROUND

1. Technology Field

The invention generally relates to a system operation method, and more particularly, to a system operation method adapted to a rewritable non-volatile memory module and a memory controller and a memory storage device using the same.

2. Description of Related Art

Along with the widespread of digital cameras, cell phones, and MP3 players in recently years, the consumers' demand to storage media has increased drastically. Rewritable non-volatile memory (for example, flash memory) is one of the most adaptable storage media to aforementioned various portable multimedia devices due to its many characteristics such as data non-volatility, low power consumption, small volume, and non-mechanical structure.

A rewritable non-volatile memory module is usually coupled with a host system through a transmission interface. Predetermined system settings of the transmission interface are determined when the rewritable non-volatile memory module is coupled to the host system. However, these system settings cannot be modified once the rewritable non-volatile memory module is in operation. Thereby, how to adjust the system settings when the host system is coupled to the rewritable non-volatile memory module has become a subject in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

An exemplary embodiment of the invention provides a system operation method, a memory controller, and a memory storage device, in which the system settings of a host interface or a connector can be modified during a boot up process.

According to an exemplary embodiment of the invention, a system operation method for controlling a rewritable non-volatile memory module is provided. The rewritable non-volatile memory module includes a plurality of physical blocks. The system operation method includes following steps. A first signal is received from a host system through a host interface. Whether a system setting of the host interface is to be modified is determined. If the system setting is to be modified, a system parameter is read from the physical blocks, and the system setting is modified according to the system parameter. A second signal is transmitted to the host system to establish a connection recognition between the rewritable non-volatile memory module and the host system.

According to an exemplary embodiment of the invention, a memory storage device including a connector, a rewritable non-volatile memory module, and a memory controller is provided. The connector is configured to couple to a host system. The rewritable non-volatile memory module includes a plurality of physical blocks. The memory controller is coupled to the connector and the rewritable non-volatile memory module. The memory controller receives a first signal from the host system and determines whether a system setting of the connector is to be modified. If the system setting is to be modified, the memory controller reads a system parameter from the physical blocks and modifies the system setting according to the system parameter. The memory controller further transmits a second signal to the host system to establish a connection recognition between the memory storage device and the host system.

According to an exemplary embodiment of the invention, a memory controller including a host interface, a memory interface, and a memory management circuit is provided. The host interface is configured to couple to a host system. The memory interface is configured to couple to a rewritable non-volatile memory module, wherein the rewritable non-volatile memory module includes a plurality of physical blocks. The memory management circuit is coupled to the host interface and the memory interface. The memory management circuit receives a first signal from the host system and determines whether a system setting of the host interface is to be modified. If the system setting is to be modified, the memory management circuit reads a system parameter from the physical blocks and modifies the system setting according to the system parameter. The memory management circuit further transmits a second signal to the host system to establish a connection recognition between the memory controller and the host system.

As described above, in a system operation method, a memory controller, and a memory storage device provided by exemplary embodiments of the invention, the system settings of a connector or a host interface can be modified during a boot up process, so that the settings of transmission between the memory storage device and a host system are made more flexible.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
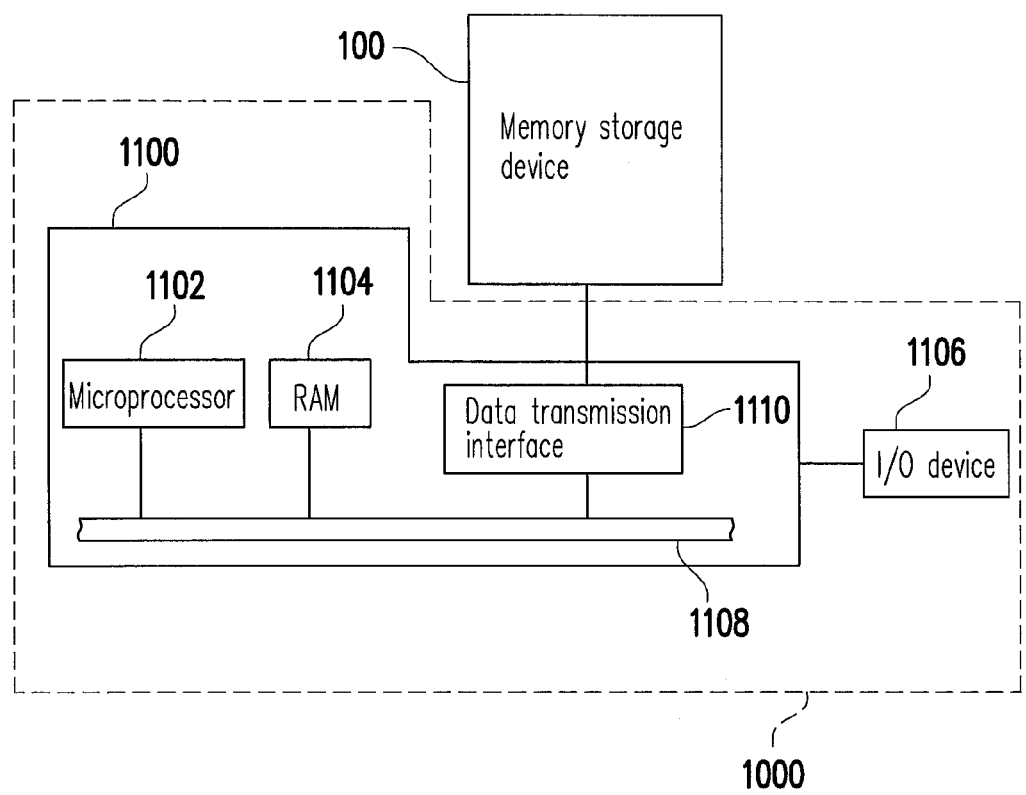
FIG. 1A illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (also referred to as a memory storage system) includes a rewritable non-volatile memory module and a controller (also referred to as a control circuit). A memory storage device is usually used with a host system so that the host system can write data into or read data from the memory storage device.

FIG. 1A illustrates a host system and a memory storage device according to an exemplary embodiment.

Figure 1B:
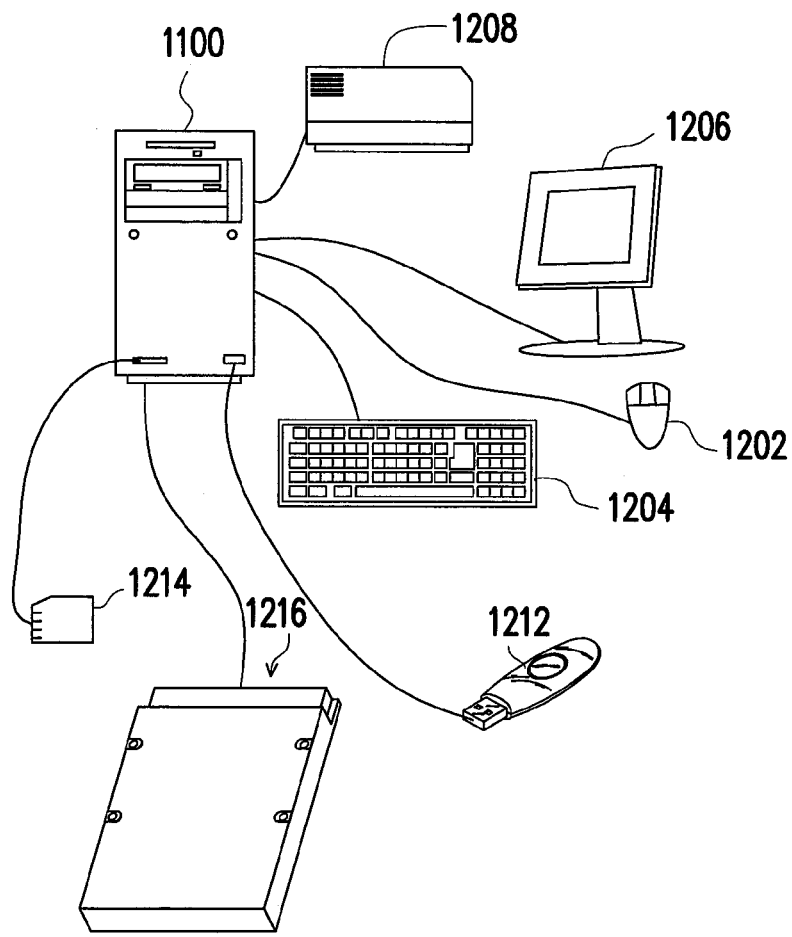
FIG. 1B is a diagram of a computer, an input/output (I/O) device, and a memory storage device according to an exemplary embodiment.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B and may further include other devices.

In the present embodiment, the memory storage device 100 is coupled to other components of the host system 1000 through the data transmission interface 1110. Data can be written into or read from the memory storage device 100 through the operations of the microprocessor 1102, the RAM 1104, and the I/O device 1106. The memory storage device 100 may be a rewritable non-volatile memory storage device, such as the flash drive 1212, the memory card 1214, or the solid state drive (SSD) 1216 illustrated in FIG. 1B.

Figure 1C:
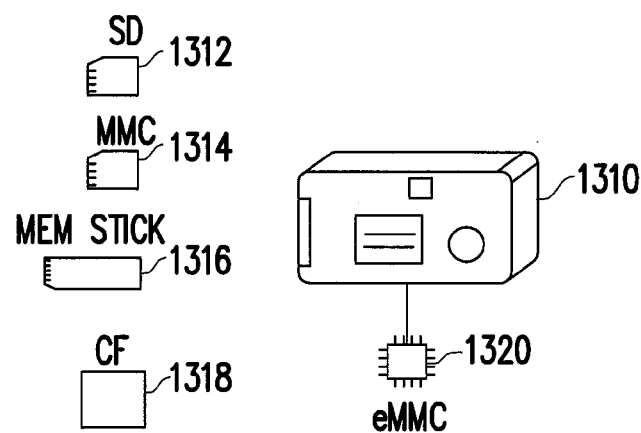
FIG. 1C is a diagram of a host system and a memory storage device according to an exemplary embodiment.

Generally speaking, the host system 1000 can be substantially any system that can work with the memory storage device 100 to store data. Even tough the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable non-volatile memory storage device is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that the eMMC is directly coupled to the motherboard of the host system.

Figure 2:
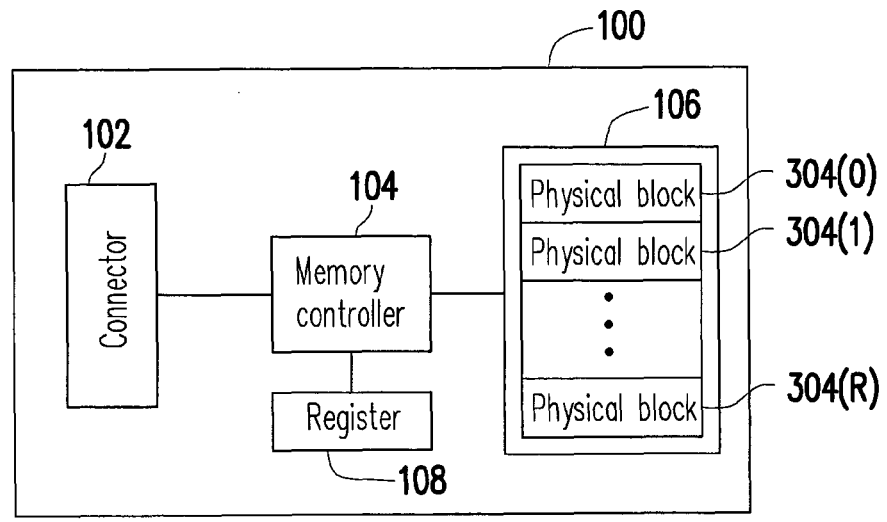
FIG. 2 is a schematic block diagram of the memory storage device in FIG. 1A.

FIG. 2 is a schematic block diagram of the memory storage device in FIG. 1A.

Referring to FIG. 2, the memory storage device 100 includes a connector 102, a memory controller 104, a rewritable non-volatile memory module 106, and a register 108.

In the present exemplary embodiment, the connector 102 complies with the serial advanced technology attachment (SATA) standard. However, the invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the secure digital (SD) interface standard, the Ultra High Speed-I (UHS-I) interface standard, the Ultra High Speed-II (UHS-II) interface standard, the memory stick (MS) interface standard, the multi media card (MMC) interface standard, the Embedded Multimedia Card (eMMC) interface standard, the Universal Flash Storage (UFS) interface standard, the compact flash (CF) interface standard, the integrated device electronics (IDE) standard, or any other suitable standard.

The memory controller 104 executes a plurality of logic gates or control instructions implemented in a hardware form or a firmware form and performs various data operations on the rewritable non-volatile memory module 106 according to commands issued by the host system 1000.

The rewritable non-volatile memory module 106 is coupled to the memory controller 104 and configured to store data written by the host system 1000. The rewritable non-volatile memory module 106 has physical blocks 304(0)-304(R). The physical blocks 304(0)-304(R) may belong to a same memory die or different memory dies. Each physical block has a plurality of physical pages, and each of the physical pages has at least one physical sector, wherein the physical pages belonging to the same physical block can be individually written but have to be erased all together. Each physical block may be composed of 128 physical pages, and each physical page may have 8 physical sectors. Namely, in the case that the capacity of each physical sector is 512 bytes, the capacity of each physical page is 4 kilobytes (KB). However, the invention is not limited thereto, and each physical block may also be composed of 64, 256, or any other number of physical pages.

To be specific, physical block is the smallest unit for erasing data. Namely, each physical block contains the least number of memory cells that are erased all together. Physical page is the smallest unit for programming data. Namely, physical page is the smallest unit for writing data. However, in another exemplary embodiment of the invention, the smallest unit for writing data may also be physical sector or another unit. Each physical page usually includes a data bit area and a redundant bit area. The data bit area is used for storing user data, and the redundant bit area is used for storing system data (for example, error checking and correcting (ECC) codes).

In the present exemplary embodiment, the rewritable non-volatile memory module 106 is a multi level cell (MLC) NAND flash memory module (i.e., each memory cell stores at least two bit data). However, the invention is not limited thereto, and the rewritable non-volatile memory module 106 may also be a single level cell (SLC) NAND flash memory module, a trinary level cell (TLC) NAND flash memory module, any other suitable flash memory module, or any other memory module having the same characteristics.

The register 108 can store a value used for determining whether the memory controller 104 needs to modify a system setting of the connector 102 during a boot up process. In the present exemplary embodiment, the register 108 stores one bit, and the value of the bit may be "0" or "1". However, the invention is not limited thereto, and in other exemplary embodiments, the register 108 may also store more bits. Additionally, in the present exemplary embodiment, the register 108 is independent to the memory controller 104 and coupled with the same. However, in another exemplary embodiment, the register 108 may also be disposed in the memory controller 104. The invention is not limited thereto.

Figure 3:
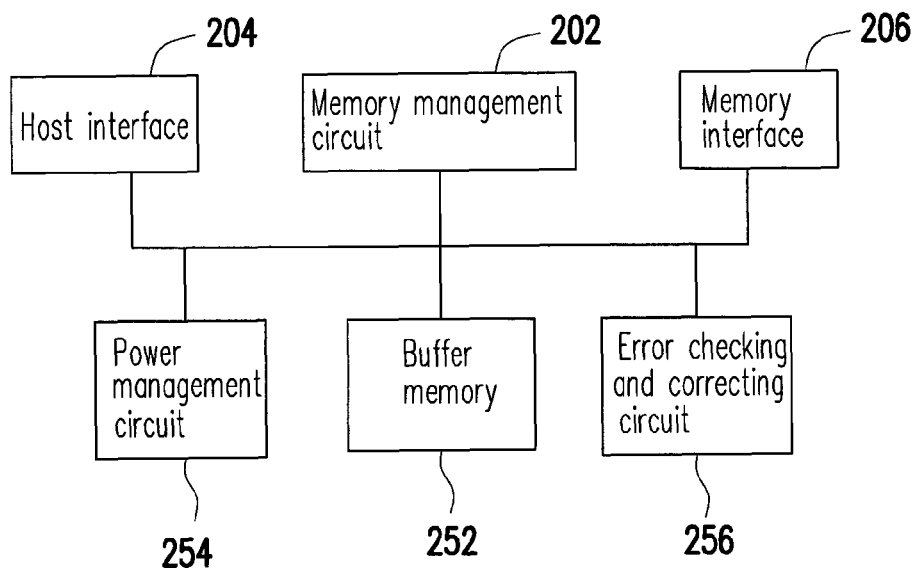
FIG. 3 is a schematic block diagram of a memory controller according to an exemplary embodiment.

FIG. 3 is a schematic block diagram of a memory controller according to an exemplary embodiment.

Referring to FIG. 3, the memory controller 104 includes a memory management circuit 202, a host interface 204, and a memory interface 206.

The memory management circuit 202 controls the overall operation of the memory controller 104. To be specific, the memory management circuit 202 has a plurality of control instructions, and when the memory storage device 100 is in operation, the control instructions are executed to perform data writing, data reading, and data erasing, etc.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage device 100 is in operation, the control instructions are executed by the microprocessor unit to carry out data writing, data reading, and data erasing, etc.

In another exemplary embodiment of the invention, the control instructions of the memory management circuit 202 may also be stored in a specific area of the rewritable non-volatile memory module 106 (for example, a system area exclusively used for storing system data in a memory module) as program codes. In addition, the memory management circuit 202 has a microprocessor unit (not shown), a ROM (not shown), and a RAM (not shown). In particular, the ROM has a driving code segment. When the memory controller 104 is enabled, the microprocessor unit first executes the driving code segment to load the control instructions from the rewritable non-volatile memory module 106 into the RAM of the memory management circuit 202. Thereafter, the microprocessor unit runs the control instructions to perform various data operations.

Moreover, in yet another exemplary embodiment of the invention, the control instructions of the memory management circuit 202 may also be implemented in a hardware form. For example, the memory management circuit 202 includes a microcontroller, a memory management unit, a memory writing unit, a memory reading unit, a memory erasing unit, and a data processing unit. The memory management unit, the memory writing unit, the memory reading unit, the memory erasing unit, and the data processing unit are coupled to the microcontroller. The memory management unit is configured to manage the physical blocks of the rewritable non-volatile memory module 106. The memory writing unit is configured to issue a write command to the rewritable non-volatile memory module 106 to write data into the rewritable non-volatile memory module 106. The memory reading unit is configured to issue a read command to the rewritable non-volatile memory module 106 to read data from the rewritable non-volatile memory module 106. The memory erasing unit is configured to issue an erase command to the rewritable non-volatile memory module 106 to erase data from the rewritable non-volatile memory module 106. The data processing unit is configured to process data to be written into and read from the rewritable non-volatile memory module 106.

The host interface 204 is coupled to the memory management circuit 202 and configured to receive and identify commands and data from the host system 1000. Namely, commands and data transmitted by the host system 1000 are transmitted to the memory management circuit 202 through the host interface 204. In the present exemplary embodiment, the host interface 204 complies with the SATA standard. However, the invention is not limited thereto, and the host interface 204 may also comply with the PATA standard, the IEEE 1394 standard, the PCI express standard, the USB standard, the SD standard, the MS standard, the MMC standard, the CF standard, the IDE standard, or any other suitable data transmission standard.

The memory interface 206 is coupled to the memory management circuit 202 and configured to access the rewritable non-volatile memory module 106. Namely, data to be written into the rewritable non-volatile memory module 106 is converted by the memory interface 206 into a format acceptable to the rewritable non-volatile memory module 106.

In an exemplary embodiment of the invention, the memory controller 104 further includes a buffer memory 252, a power management circuit 254, and an ECC circuit 256.

The buffer memory 252 is coupled to the memory management circuit 202 and configured to temporarily store data and commands from the host system 1000 or data from the rewritable non-volatile memory module 106.

The power management circuit 254 is coupled to the memory management circuit 202 and configured to control the power supply of the memory storage device 100.

The ECC circuit 256 is coupled to the memory management circuit 202 and configured to execute an ECC procedure to ensure data accuracy. To be specific, when the memory management circuit 202 receives a write command from the host system 1000, the ECC circuit 256 generates a corresponding ECC code for the data corresponding to the write command, and the memory management circuit 202 writes the data corresponding to the write command and the corresponding ECC code into the rewritable non-volatile memory module 106. Subsequently, when the memory management circuit 202 reads the data from the rewritable non-volatile memory module 106, it also reads the ECC code corresponding to the data, and the ECC circuit 256 executes the ECC procedure on the data according to the ECC code.

Figure 4:
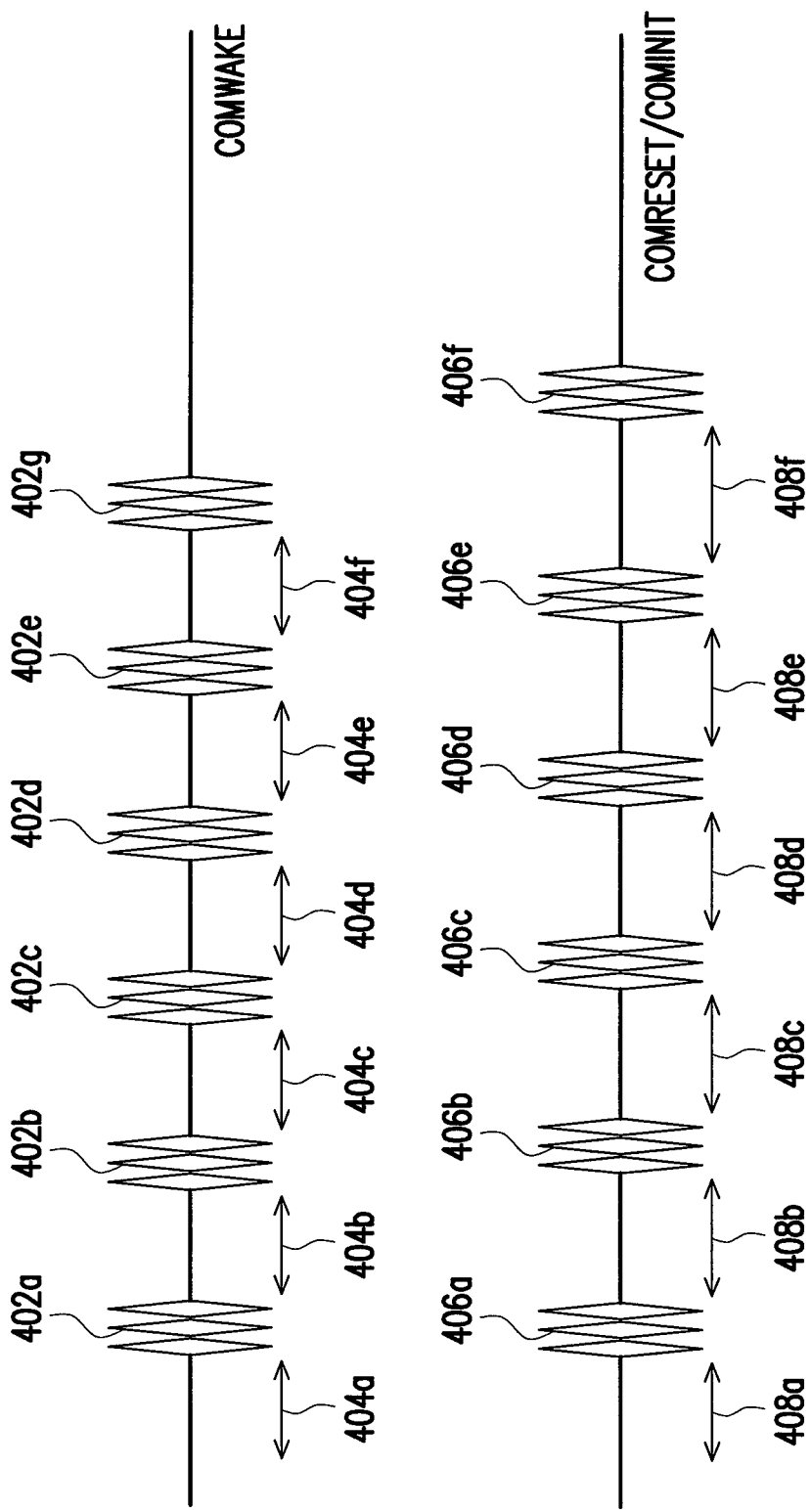
FIG. 4 is a diagram illustrating examples of out-of-band (OOB) signals according to an exemplary embodiment.

When the memory storage device 100 is coupled to the host system 1000, the memory management circuit 202 exchanges a plurality of signals with the host system 1000 to establish a connection recognition between the memory storage device 100 and the host system 1000. The connection recognition is established to allow the host system 1000 to recognize the memory storage device 100 and allow a channel to be established between the host system 1000 and the rewritable non-volatile memory module 106 for transmitting data. For example, the memory management circuit 202 and the host system 1000 can establish the connection recognition through out-of-band signalling (OOB-signaling). The signals exchanged between the host system 1000 and the memory management circuit 202 may be a COMRESET signal, a COMINIT signal, and a COMWAKE signal. The COMRESET signal is generated by the host system 1000 and used for resetting the channel coupled between the host system 1000 and the rewritable non-volatile memory module 106. For example, after the channel is reset, the host system 1000 and the memory management circuit 202 may further determine the transmission frequency of the channel. The COMINIT signal is generated by the memory storage device 100 and used for requesting a communication initialization. The COMWAKE signal is used for notifying the host system 1000 and the memory storage device 100 to enter a transmission frequency coordination procedure. For example, the host system 1000 and the memory storage device 100 generate synchronous signals to understand the capabilities of each other, so as to know the difference between the transmission frequencies of each other and adopt a transmission frequency acceptable to both parties. Herein the COMWAKE signal can be generated by the host system 1000 and the memory storage device 100. These OOB signals are transmitted as idle signals and burst signals. For example, as shown in FIG. 4, the COMWAKE signal is composed of burst signals 402a-402f and idle signals 404a-404f, and the COMRESET signal and the COMINIT signal are composed of burst signals 406a-406f and idle signals 408a-408f. However, the invention is not limited thereto, and in another exemplary embodiment, the memory management circuit 202 and the host system 1000 may also establish the connection recognition through in channel signaling, in band signaling, or common channel signalling.

Figure 5:
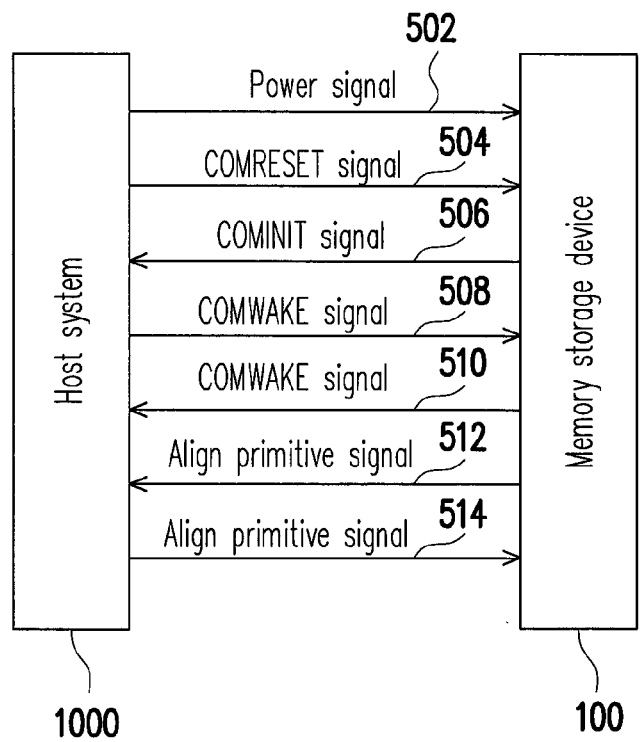
FIG. 5 is a diagram illustrating an example of establishing a connection recognition according to an exemplary embodiment.

FIG. 5 is a diagram illustrating an example of establishing a connection recognition according to an exemplary embodiment.

Referring to FIG. 5, when the memory storage device 100 is coupled to the host system 1000, the host system 1000 transmits a power signal 502 to the memory management circuit 202 and supplies a power to various components of the memory storage device 100. Then, the memory management circuit 202 receives a COMRESET signal 504 (also referred to as a first signal) from the host system 1000. The memory management circuit 202 reads the value stored in the register 108 and determines whether the system settings of the connector 102 and the host interface 204 needs to be modified. In the present exemplary embodiment, the connector 102 and the host interface 204 comply with the same transmission standard (for example, SATA). Thus, changing a system setting of the connector 102 is equivalent to changing a system setting of the host interface 204. For the convenience of description, when a system setting of the host interface 204 is modified, a system setting of the connector 102 is also modified. For example, when the value stored in the register 108 is "1", the system setting of the host interface 204 needs to be modified, and when the value stored in the register 108 is "0", the system setting of the host interface 204 needs not to be modified.

In another exemplary embodiment, the memory controller 104 has a plurality of pins, including a general purpose input output (GPIO) pin. The GPIO pin is connected to a high-level voltage (for example, +5V) or a low-level voltage (for example, the ground). The memory management circuit 202 determines whether the system setting of the host interface 204 needs to be modified according to the voltage level on the GPIO pin. For example, when the voltage level on the GPIO pin is the high-level voltage, the memory management circuit 202 determines that the system setting of the host interface 204 needs to be modified, and when the voltage level on the GPIO pin is the low-level voltage, the memory management circuit 202 determines that the system setting of the host interface 204 needs not to be modified. However, the invention is not limited thereto, and in other exemplary embodiments, the memory management circuit 202 may also determine that the system setting of the host interface 204 needs to be modified when the voltage level on the GPIO pin is the low-level voltage.

If the system setting of the host interface 204 needs not to be modified, the memory management circuit 202 transmits a COMINIT signal 506 (also referred to as a second signal) to the host system 1000.

If the system setting of the host interface 204 needs to be modified, the memory management circuit 202 first reads a system parameter from the physical blocks 304(0)-304(R). The system parameter indicates how the system setting of the host interface 204 should be modified. For example, the system parameter can be used for determining the transmission frequency of the host interface 204. In the present exemplary embodiment, the host interface 204 complies with the SATA standard, and the transmission frequency of the host interface 204 may be SATA 6G, SATA 3G, or SATA 1.5G. The memory management circuit 202 determines which transmission frequency should be adopted according to the system parameter. After changing the system setting (for example, transmission frequency, bandwidth, or number of transmission channels) of the host interface 204 according to the system parameter, the memory management circuit 202 sets the value in the register 108 to "0". After that, the memory management circuit 202 transmits a COMINIT signal 506 (also referred to as a second signal) to the host system 1000 to establish a connection recognition between the memory storage device 100 and the host system 1000.

After the COMINIT signal 506 is received, a transmission frequency coordination procedure is carried out between the host system 1000 and the memory management circuit 202 to adjust the transmission frequency of the host system 1000 and the rewritable non-volatile memory module 106. For example, the host system 1000 transmits a COMWAKE signal 508 to the memory management circuit 202. After receiving the COMWAKE signal 508 from the host system 1000, the memory management circuit 202 transmits a COMWAKE signal 510 to the host system 1000. Then, the host system 1000 and the memory management circuit 202 coordinate their transmission frequency by exchanging an align primitive signal 512 and an align primitive signal 514 (also referred to as ALIGN signals). As a result, the host system 1000 and the memory storage device 100 can transmit data back and forth by using the transmission frequency. Thereby, the connection recognition between the memory storage device 100 and the host system 1000 is accomplished.

Additionally, in an exemplary embodiment, the memory management circuit 202 groups the physical blocks 304(0)-304(R) into a data area and a hidden area. The memory management circuit 202 also configures a plurality of logical block addresses to map to the physical blocks in the data area. These logical block addresses are provided to the host system 1000 to be accessed. Accordingly, the host system 1000 can access the physical blocks in the data area through the logical block addresses but cannot access the physical blocks in the hidden area. In particular, the memory management circuit 202 reads the system parameter from the physical blocks in the hidden area. The hidden area may be further divided into a replacement area and a system area. The system area is used for storing system information, and the physical blocks in the replacement area are used as a buffer memory for writing data or for replacing the physical blocks in the data area. In an exemplary embodiment, the memory management circuit 202 reads the system parameter from the physical blocks in the system area.

In the exemplary embodiment illustrated in FIG. 5, the memory management circuit 202 transmits the COMINIT signal 506 to the host system 1000 after it receives the COMRESET signal 504. However, in another exemplary embodiment, the memory management circuit 202 transmits the COMINIT signal 506 to the host system 1000 first.

Figure 6:
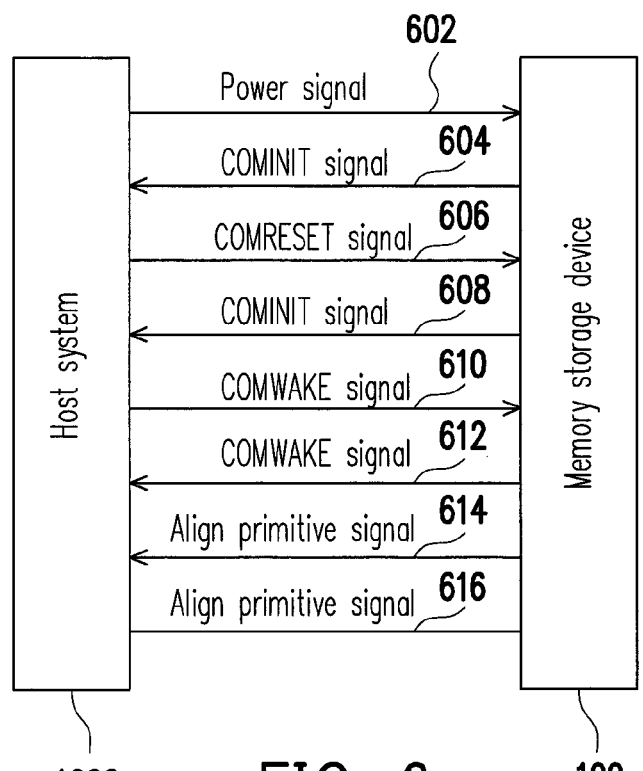
FIG. 6 is a diagram illustrating an example of establishing a connection recognition according to another exemplary embodiment.

FIG. 6 is a diagram illustrating an example of establishing a connection recognition according to another exemplary embodiment.

Referring to FIG. 6, in the exemplary embodiment illustrated in FIG. 6, when the memory storage device 100 is coupled to the host system 1000, the host system 1000 transmits a power signal 602 (also referred to as a first signal) to the memory storage device 100 to supply power to various components of the memory storage device 100. After receiving the power signal 602, the memory management circuit 202 determines whether a system setting of the host interface 204 needs to be modified. If the system setting of the host interface 204 needs to be modified, the memory management circuit 202 reads a system parameter from the physical blocks 304(0)-304(R) and modifies the system setting of the host interface 204 according to the system parameter. However, the steps of reading the system parameter and modifying the system setting of the host interface 204 have been described in detail above therefore will not be described herein. Particularly, the memory management circuit 202 then transmits a COMINIT signal 604 (also referred to as a second signal) to the host system 1000 to notify the host system 1000 to start establishing a connection recognition between the memory storage device 100 and the host system 1000. After that, the host system 1000 transmits a COMRESET signal 606 to the memory management circuit 202, and the memory management circuit 202 transmits a COMINIT signal 608 to the host system 1000. Besides, a transmission frequency coordination procedure is carried out between the host system 1000 and the memory management circuit 202 to adjust the transmission frequency of the host system 1000 and the rewritable non-volatile memory module 106. For example, the host system 1000 transmits a COMWAKE signal 610 to the memory management circuit 202. After receiving the COMWAKE signal 610 from the host system 1000, the memory management circuit 202 transmits a COMWAKE signal 612 to the host system 1000. After that, the host system 1000 and the memory management circuit 202 exchange an align primitive signal 614 and an align primitive signal 616 (also referred to as ALIGN signals) to coordinate their transmission frequency. Thereby, the connection recognition between the memory storage device 100 and the host system 1000 can be accomplished.

Figure 7:
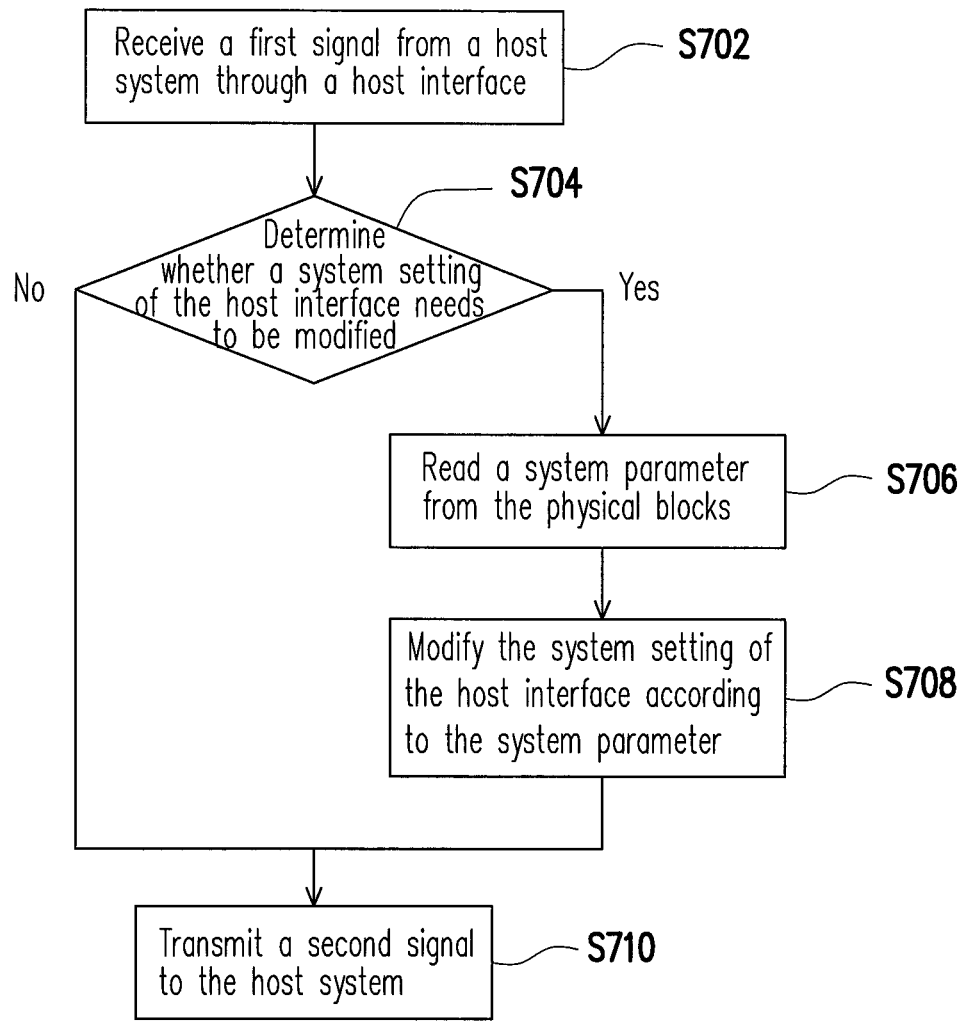
FIG. 7 is a flowchart of a system operation method according to an exemplary embodiment.

FIG. 7 is a flowchart of a system operation method according to an exemplary embodiment.

Referring to FIG. 5, in step S702, the memory management circuit 202 receives a first signal (for example, a COMRESET signal or a power signal) from the host system 1000 through a host interface. Is step S704, the memory management circuit 202 determines whether a system setting of the host interface needs to be modified.

If the system setting of the host interface needs to be modified, in step S706, the memory management circuit 202 reads a system parameter from the physical blocks. In next step S708, the memory management circuit 202 modifies the system setting of the host interface according to the system parameter.

After step S708, or if the system setting of the host interface needs not to be modified, step S710 is executed, in which the memory management circuit 202 transmits a second signal (for example, a COMINIT signal) to the host system 1000.

As described above, exemplary embodiments of the invention provide a system operation method and a memory controller and a memory storage device using the same, in which the system settings of a host interface and a connector can be modified when the memory storage device is coupled to a host system, so that the settings of transmission between the host system and the memory storage device are made more flexible.

The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A system operation method, for controlling a rewritable non-volatile memory module, wherein the rewritable non-volatile memory module comprises a plurality of physical blocks, the system operation method comprising:
   receiving a first signal from a host system through a host interface;
   determining whether to modify a transmission frequency of the host interface;
   when the transmission frequency is to be modified, reading a system parameter from the physical blocks of the rewritable non-volatile memory module, and changing the transmission frequency according to the system parameter before a channel between the host system and the rewritable non-volatile memory module is established for transmitting data; and
   transmitting a second signal to the host system to establish a connection recognition between the rewritable non-volatile memory module and the host system.

2. The system operation method according to claim 1, wherein the step of determining whether to modify the transmission frequency of the host interface comprises:
   determining whether to modify the transmission frequency of the host interface according to a value stored in a register.

3. The system operation method according to claim 1, wherein the step of determining whether to modify the transmission frequency of the host interface comprises:
   determining whether to modify the transmission frequency of the host interface according to a voltage level on a pin.

4. The system operation method according to claim 1, wherein the step of reading the system parameter from the physical blocks comprises:
   grouping the physical blocks into a data area and a hidden area; and
   reading the system parameter from the physical blocks in the hidden area.

5. The system operation method according to claim 1, wherein the first signal is a COMRESET signal for resetting a channel coupled between the host system and the rewritable non-volatile memory module, and the second signal is a COMINIT signal for notifying the host system to establish the connection recognition.

6. The system operation method according to claim 1, wherein the first signal is a power signal for supplying a power to the rewritable non-volatile memory module, and the second signal is a COMINIT signal for notifying the host system to start establishing the connection recognition.

7. The system operation method according to claim 1, wherein the step of changing the transmission frequency according to the system parameter comprises:
changing a transmission frequency of the host interface according to the system parameter.

8. The system operation method according to claim 1 further comprising:
executing a transmission frequency coordination procedure to adjust a transmission frequency of the host system and the rewritable non-volatile memory module.

9. A memory storage device, comprising:
a connector, configured to couple to a host system;
a rewritable non-volatile memory module, comprising a plurality of physical blocks; and
a memory controller, coupled to the connector and the rewritable non-volatile memory module,
wherein the memory controller is configured to receive a first signal from the host system and determine whether to modify a transmission frequency of the connector,
wherein when the transmission frequency is to be modified, the memory controller is configured to read a system parameter from the physical blocks of the rewritable non-volatile memory module and modify the transmission frequency according to the system parameter before a channel between the host system and the rewritable non-volatile memory module is established for transmitting data,
wherein the memory controller is configured to transmit a second signal to the host system to establish a connection recognition between the memory storage device and the host system.

10. The memory storage device according to claim 9 further comprising:
a register, coupled to the memory controller,
wherein the memory controller is configured to determine whether to modify the transmission frequency of the connector according to a value stored in the register.

11. The memory storage device according to claim 9, wherein the memory controller further comprises a pin, and the memory controller is configured to determine whether to modify the transmission frequency according to a voltage level on the pin.

12. The memory storage device according to claim 9, wherein the memory controller is further configured to group the physical blocks into a data area and a hidden area, and read the system parameter from the physical blocks in the hidden area.

13. The memory storage device according to claim 9, wherein the first signal is a COMRESET signal for resetting a channel coupled between the memory storage device and the host system, and the second signal is a COMINIT signal for notifying the host system to establish the connection recognition.

14. The memory storage device according to claim 9, wherein the first signal is a power signal for supplying a power to the memory storage device, and the second signal is a COMINIT signal for notifying the host system to start establishing the connection recognition.

15. The memory storage device according to claim 9, wherein the memory controller is further configured to modify a transmission frequency of the connector according to the system parameter.

16. The memory storage device according to claim 9, wherein the memory controller is further configured to execute a transmission frequency coordination procedure to adjust a transmission frequency of the host system and the rewritable non-volatile memory module.

17. A memory controller, for controlling a rewritable non-volatile memory module, wherein the rewritable non-volatile memory module comprises a plurality of physical blocks, the memory controller comprising:
a host interface, configured to couple to a host system;
a memory interface, configured to couple to the rewritable non-volatile memory module; and
a memory management circuit, coupled to the host interface and the memory interface,
wherein the memory management circuit is configured to receive a first signal from the host system and determine whether to modify a transmission frequency of the connector,
wherein when the transmission frequency is to be modified, the memory management circuit is configured to read a system parameter from the physical blocks of the rewritable non-volatile memory module and modify the transmission frequency according to the system parameter before a channel between the host system and the rewritable non-volatile memory module is established for transmitting data,
wherein the memory management circuit is configured to transmit a second signal to the host system to establish a connection recognition between the memory controller and the host system.

18. The memory controller according to claim 17, wherein the memory management circuit is configured to determine whether to modify the transmission frequency of the host interface according to a value stored in a register.

19. The memory controller according to claim 17 further comprising a pin, wherein the memory management circuit is configured to determine whether to modify the transmission frequency according to a voltage level on the pin.

20. The memory controller according to claim 17, wherein the memory management circuit is configured to group the physical blocks into a data area and a hidden area, and read the system parameter from the physical blocks in the hidden area.

21. The memory controller according to claim 17, wherein the first signal is a COMRESET signal for resetting a channel coupled between the memory controller and the host system, and the second signal is a COMINIT signal for notifying the host system to establish the connection recognition.

22. The memory controller according to claim 17, wherein the first signal is a power signal for supplying a power to the memory controller, and the second signal is a COMINIT signal for notifying the host system to start establishing the connection recognition.

23. The memory controller according to claim 17, wherein the memory management circuit is configured to modify a transmission frequency of the host interface according to the system parameter.

24. The memory controller according to claim 17, wherein the memory management circuit is further configured to execute a transmission frequency coordination procedure to adjust a transmission frequency of the host system and the rewritable non-volatile memory module.

* * * * *